United States Patent [19]

De Bart et al.

[11] Patent Number: 6,088,828
[45] Date of Patent: Jul. 11, 2000

[54] TRANSMISSION SYSTEM WITH IMPROVED LOCK DETECTION

[75] Inventors: Abraham J. De Bart, Nuenen; Frits A. Steenhof, Eindhoven, both of Netherlands

[73] Assignee: U.S. Philips Corporation, New York, N.Y.

[21] Appl. No.: 08/927,886

[22] Filed: Sep. 11, 1997

[30] Foreign Application Priority Data

Sep. 17, 1996 [EP] European Pat. Off. .............. 96202588

[51] Int. Cl.[7] .................................................. H03M 13/33
[52] U.S. Cl. ........................ 714/789; 714/795; 714/798
[58] Field of Search .................................. 714/789, 795, 714/798, 820, 821

[56] References Cited

U.S. PATENT DOCUMENTS

| | | |
|---|---|---|
| 5,233,630 | 8/1993 | Wolf ........................................... 375/67 |
| 5,287,374 | 2/1994 | Parr ........................................... 371/43 |
| 5,341,401 | 8/1994 | Fajjh et al. ................................. 375/94 |
| 5,469,452 | 11/1995 | Zehavi ....................................... 371/43 |
| 5,485,486 | 1/1996 | Gilhousen et al. ...................... 375/205 |
| 5,509,020 | 4/1996 | Iwakiri et al. ............................. 371/43 |
| 5,537,444 | 7/1996 | Nill et al. ................................. 375/341 |
| 5,566,206 | 10/1996 | Butler et al. ............................ 375/225 |
| 5,638,361 | 6/1997 | Ohlson et al. ........................... 370/342 |
| 5,638,408 | 6/1997 | Takaki ..................................... 375/341 |
| 5,671,255 | 9/1997 | Wang et al. ............................. 375/341 |
| 5,710,784 | 1/1998 | Kindred et al. ........................... 371/43 |
| 5,754,600 | 5/1998 | Rahnema ................................ 375/341 |
| 5,796,757 | 8/1998 | Czaja ........................................ 371/46 |
| 5,838,697 | 11/1998 | Abe ........................................ 371/43.8 |
| 5,878,098 | 3/1999 | Wang et al. ............................. 375/377 |

*Primary Examiner*—Stephen M. Baker
*Attorney, Agent, or Firm*—Robert J. Kraus

[57] ABSTRACT

In order to find the position of the boundary between transmitted codewords, in a receiver a reliability measure for two possible positions are compared. If a relative difference measure of these reliability measure exceeds a predetermined threshold value, the reliability measure indicating the largest reliability corresponds to the correct position of the boundary between the codewords.

11 Claims, 4 Drawing Sheets

TRANSMISSION SYSTEM WITH IMPROVED LOCK DETECTION

BACKGROUND OF THE INVENTION

The present invention is related to a transmission system comprising a transmitter for transmitting digital symbols via a transmission medium to a receiver, said receiver being provided with a decoder for deriving decoded symbols from an input signal of the receiver having a predetermined signal property out of a plurality of possible signal properties, said receiver comprising property determining means for determining said predetermined signal property from the received signal by determining the reliability of the decoded symbols, the property determining means further being arranged for deriving at least a first sequence of decoded digital symbols assuming a first signal property and a second sequence of decoded digital symbols assuming a second signal property.

The invention is also related to a transmission method and a receiver for receiving a signal having a predetermined signal property out of a plurality of possible signal properties.

A transmission system according to the preamble is known from the paper "Syndrome-based Viterbi decoder Node Synchronisation and Out-of lock Detection" by M. Moeneclay and P. Sanders published in the conference records of GLOBECOM '90, Volume 1, pp. 604–608.

DVB (Digital Video Broadcast) is the new European standard for digital video transmission. This standard prescribes the source coding scheme and the channel coding scheme. For satellite based transmission (DVB-S), the source coding involves a concatenated coding scheme using a Reed-Solomon code as outer code, and a rate 1/2, k=7 convolutional code as inner code. The rate of said convolutional code can be increased by means of puncturing. Between the RS-encoder and the convolutional encoder an interleaver is introduced for spreading burst errors over different Reed-Solomon codewords.

Because a DVB signal can carry various types of video- and audio signals, such a DVB signal can have a large number of signal properties. These signal properties are not known beforehand at the receiver. Signal properties are e.g. a reference phase of the carrier phase in the case of QPSK modulation, the actual rate of the convolutional code used and the starting position of the puncturing map. In case of a non-DVB system in which a block code is used as inner code, the position of the boundary between two codewords is a further signal property. In order to determine the actual signal properties of the received signal, the receiver comprises property determining means for determining said signal properties from the received signal.

In order to find the used signal properties, all possibilities are tried until the correct signal property is found. There are several known way to determine whether an actually tried signal property is the correct one.

A first way to determine whether an actually tried signal property is the correct one is to recode the decoded symbols according to the assumed signal property, and comparing the input symbols with the recoded symbols. If the symbol error rate is small, it is likely that the chosen property is correct. If the error rate is high the chosen property is incorrect, and the next one has to be tried. A disadvantage of the above mentioned method is the required additional implementation complexity needed for the recoding.

A second way to determine whether an actually tried signal property is the correct one is to use a reliability measure for the decoded digital symbols which reliability measure is often already available within the receiver. In the transmission system according to the above mentioned conference paper, the reliability measure used is the path metric growth in the Viterbi decoder for decoding the inner code. In said transmission system, a first signal property is tried, and the reliability measure is compared with a threshold. Subsequently a second signal property is tried, and again the reliability measure is compared with the threshold. When in both cases the reliability measure exceeds the threshold, it is decided that both signal properties were incorrect.

A problem with the above mentioned transmission system is that the reliability measure varies in dependence on the signal property of the transmitted signal. The reliability measure varies strongly with the rate of the inner code. Simulations have shown that the reliability measure for a decoder that incorrectly assumes a rate 3/8 suggests a higher reliability than the reliability measure for a decoder that correctly assumes a rate 1/2. Furthermore the reliability measure is also affected by the signal to noise ratio. This all requires that the threshold levels are set to values that are dependent on the rate of the inner code, the signal to noise ratio etc.

SUMMARY OF THE INVENTION

The object of the present invention is to provide a transmission system according to the preamble in which constant threshold levels can be used.

To achieve this object the present invention is characterised in that the property determining means are arranged for indicating the signal property corresponding to the sequence of decoded symbols having the highest reliability as the correct signal property if a relative difference measure of the reliability measures of the first and second sequence of decoded symbols exceeds a predetermined value.

By comparing a relative difference value of the reliability measures with a threshold value, instead of comparing the reliability measures themselves with a threshold value, it is obtained that only the relative difference matters when deciding whether or not one of the involved signal properties is correct. This relative difference is independent from the signal to noise ratio and the actual rate assumed. Consequently a fixed value for the threshold value can be chosen.

An embodiment of the invention is characterised in that the transmitter comprises an encoder for encoding digital symbols according to one out of a plurality of codes, in that the signal property comprises at least the code used by the encoder and a further property, and in that the property determining means are arranged for deriving the at least first and second sequence of symbols by assuming the use of the same code but differing in at least the further property.

By comparing only situations in which the rate of the code is the same, it is avoided that the rate dependence of the reliability measure causes relative difference measures exceeding erroneously the threshold value.

A further embodiment of the present invention is characterised in that the reliability measure is proportional to the time required to obtain a predetermined increase of a path metric associated with the corresponding sequence of digital symbols.

By determining the time required for obtaining a predetermined increase of a path metric, a reliability measure of a decoded signal is obtained in the fastest way. The accuracy of the reliability measure depends on the required increase of the path metric. If the required increase of the path metric is fixed, a given accuracy is guaranteed. If the path metric grows quickly, the predetermined increase, and consequently the reliability measure, is obtained very rapidly.

A way of implementing this way of determining the reliability measure is counting the number of symbol periods required for obtaining a fixed number of overflows of the register in which the path metric is stored.

BRIEF DESCRIPTION OF THE DRAWING

The invention will now be explained with reference to the drawing figures.

DESCRIPTION OF THE PREFERRED EMBODIMENTS

Figure 1:
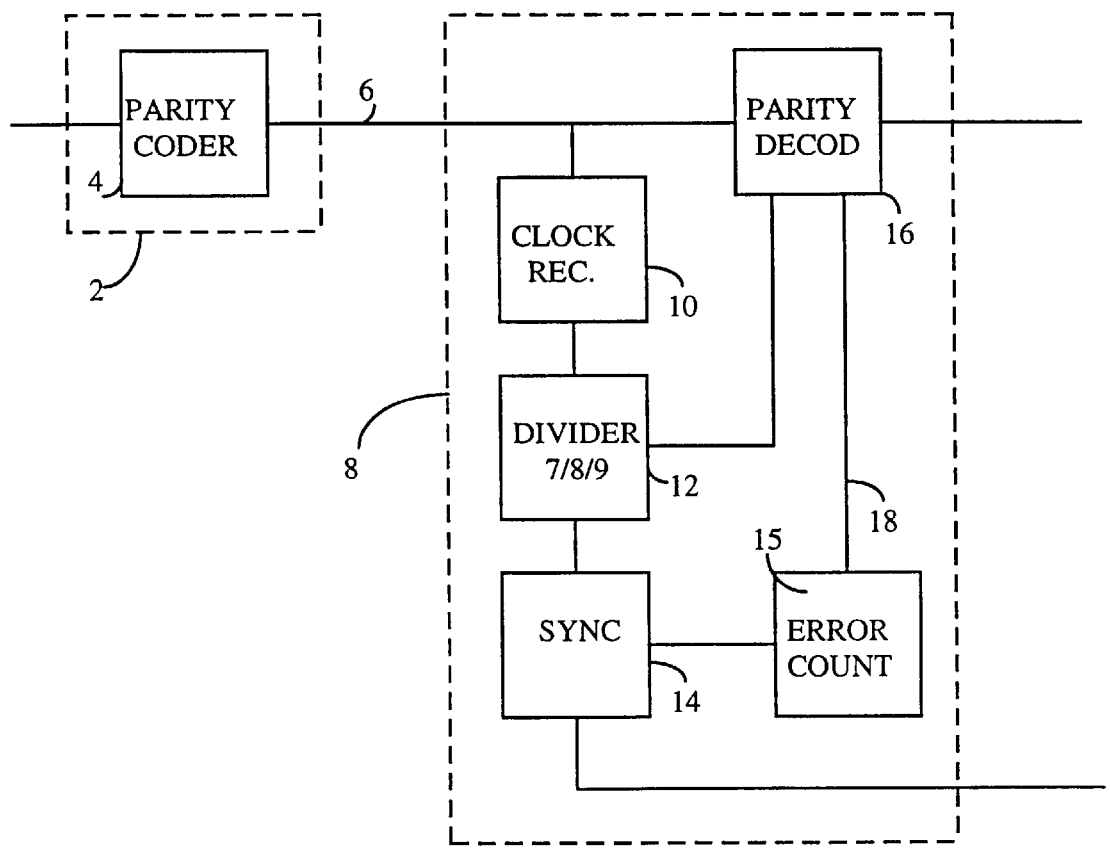
FIG. 1 shows a first embodiment of a transmission system according to the invention in which a parity check code is used.

In the transmission system according to FIG. 1, the input symbols are applied to a parity encoder 4 in a transmitter 2. The output of the transmitter 2 is connected to the receiver 8 via the transmission medium 6.

The input of the receiver 8 is connected to the input of a parity decoder 16 and to an input of a clock recovery circuit 10. At a first output of the parity decoder 16 the decoded output symbols are available. A second output of the parity decoder 16, carrying a signal indicating parity errors, is connected to a error counter 15. The output of the error counter 15 is connected to an input of the property determining means 14.

An output of the clock recovery circuit 10 is connected to an input of a 7/8/9 frequency divider 12. A first output of the property determining means 14 is connected to a control input of the 7/8/9 frequency divider 12. An output of the frequency divider 12 is connected to a reset input of the parity decoder 16.

In the transmission system according to FIG. 1 the source symbols at the input are encoded using a parity code with one parity bit and 7 data bits by the parity encoder 4. This encoded bits are transmitted by the transmitter 2 to the receiver 10. The signal property to be determined by the receiver is here the boundary between two code words. The decoder 16 assumes an arbitrary position of said boundary. The parity decoder 16 is reset after each group of 8 bits by a pulse from the 7/8/9 frequency divider 12 for starting the decoding of a new codeword. The 7/8/9 frequency divider 12 receives a bitclock from the clock recovery circuit 10. Each time a parity error occurs, this is signalled to the error counter 15 which counts the number of parity errors. The number of parity errors counted by the error counter 15 is here the reliability measure according to the inventive concept of the present invention. The signal property determining means 14 read after a predetermined period of time the numbers of errors made, and stores this number in a buffer memory. Subsequently the signal property means 14 issue a control signal to the frequency divider 12 to cause it to divide by 7, instead of by 8. This causes the parity decoder 16 to be reset one clock pulse earlier, leading to a shift of one bit of the word boundary. Thereafter the number of parity errors counted by the error counter 15 in the predetermined period of time is read by the property determining means 14.

The property determining means 14 calculate a relative difference measure Δ of the actual counted value and the previously stored value. This can be done according to:

$$\Delta = \frac{ABS(COUNT_1 - COUNT_2)}{MIN(COUNT_1, COUNT_2)} \quad (1)$$

In (1) $COUNT_1$ is the stored counted value, and $COUNT_2$ is the actually counted value. ABS means the absolute value of its argument, and MIN, means the minimum value of its arguments. If Δ is smaller than a predetermined threshold value, it is assumed that the tried word boundaries are not the correct one, and subsequently again a shift of the word boundary is introduced and the number of errors are counted again. If Δ is smaller than said predetermined threshold value, it is assumed according to the present inventive concept that the word boundary corresponding to the smallest error count is the correct one. If the stored count is the smallest one, the divider is controlled to divide by 9, in order to shift the word boundary back to the previous position. The means for deriving the signal property also signals at the output of the receiver that the correct word boundary has been found.

Figure 2:
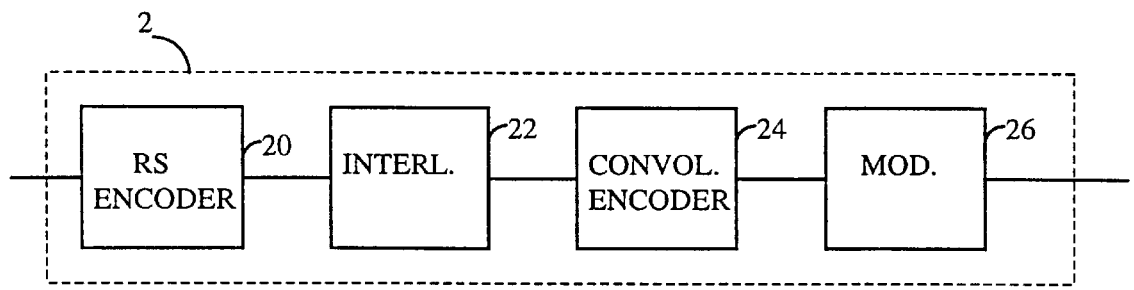
FIG. 2 shows a transmitter 2 to be used in a transmission system according to a second embodiment of the invention in which a concatenated coding scheme is used.

In the transmitter 2 according to FIG. 2, the source symbols are applied to a Reed-Solomon encoder 20. The output of the Reed-Solomon encoder is connected to an input of an interleaver 22. The output of the interleaver 22 is connected to an input of a convolutional encoder 24. The output of the convolutional encoder 24 is connected to an input of a QPSK modulator 26. At the output of the QPSK modulator 26, the output signal of the transmitter is available.

In the transmitter 2 according to FIG. 2 a so-called concatenated coding scheme is used. The advantage of such scheme is the drastically increased slope of the BER curve as function of the ratio $E_b/N_0$ between the energy per bit and the noise density, leading to very low error probabilities at modest $E_b/N_0$. In the transmitter according to FIG. 2, the source symbols are coded using a Reed-Solomon code. For digital video broadcast transmission a suitable code is a Reed-Solomon code RS(204,188,T=8) code, i.e. a Reed-Solomon code having 204 symbols, of which 188 are data symbols. The number of symbol errors T having an unknown position that can be corrected is equal to 8. The RS(204,188,T=8) code can be derived by shortening a RS(255,239,T=8) Reed-Solomon code by adding 51 bytes, all set to zero, before applying the symbols to be encoded to a RS(255,239) coder.

The RS encoded symbols are interleaved by the interleaver 22 to spread out burst errors over more than 1 RS code word, in order to reduce the number of uncorrectable code words. Subsequently the interleaved symbols are encoded by a convolutional encoder 24.

The convolutional encoder is arranged for encoding the interleaved symbols according to a rate 1/2, k=7 convolutional code of which the rate can be increased by puncturing. The possible rates are 1/2, 2/3, 3/4, 4/5, 5/6 and 7/8 (In general N/N+1). Encoders for punctured convolutional coder are well known to those skilled in the art. The operation of a convolutional encoder is explained in the data sheet of the Q1650 k=7, Multi-Code Rate Viterbi decoder, pp. 6–9, Qualcomm Inc. The subject is also treated in numerous textbooks.

The coded symbols at the output of the convolutional encoder 24 are modulated according the QPSK modulation scheme in order to be transmitted.

Figure 3:
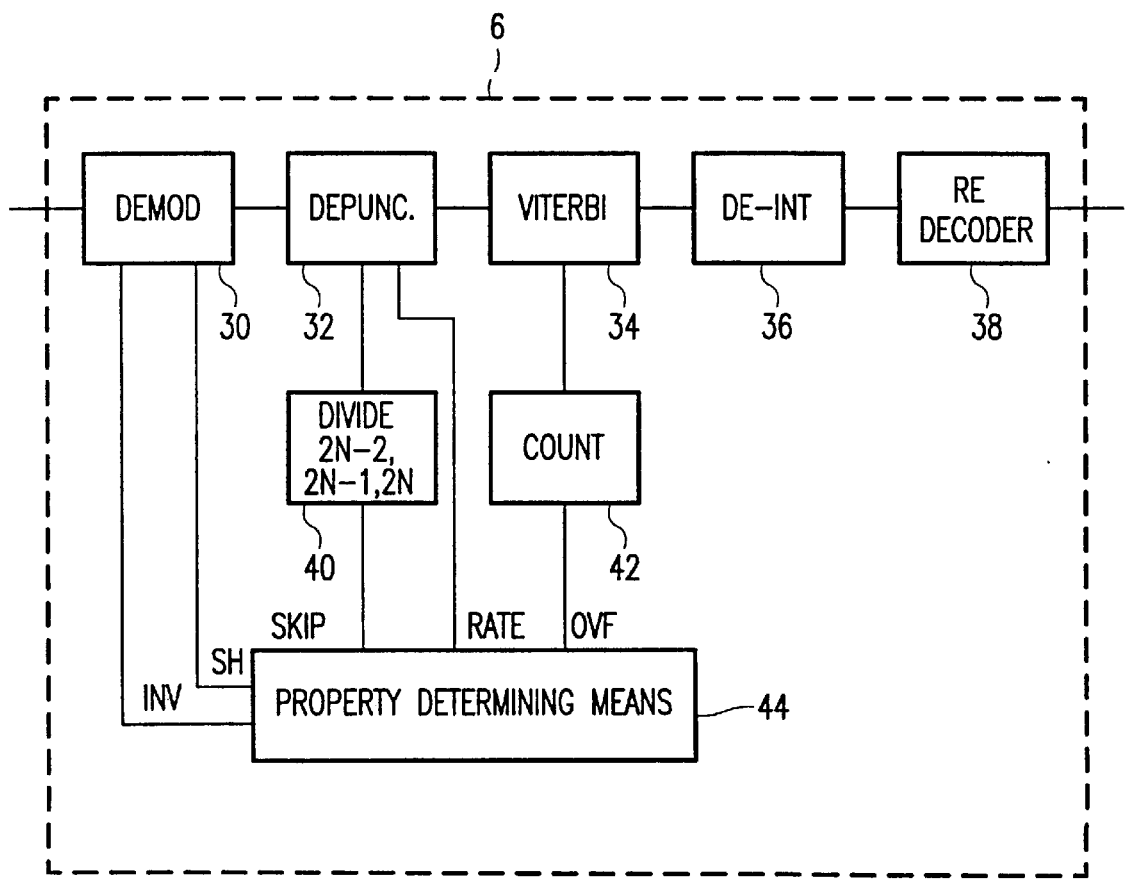
FIG. 3 shows a receiver 6 to be used in the transmission system according to a second embodiment of the invention.

In the receiver 6 according to FIG. 3, the input signal is applied to a demodulator 30. An output of the demodulator 30 is connected to a depuncturing unit 32. The output of the depuncturing unit 32 is connected to a Viterbi decoder 34. A first output of the Viterbi decoder 34 is connected to an input of a de-interleaver 36. The output of the de-interleaver 36 is connected to an input of a Reed-Solomon decoder 38. At the output of the Reed-Solomon decoder 38 the decoded symbols are available.

A second output of the Viterbi decoder 34, carrying a signal indicating overflows of the buffer memory holding one of the path metrics in the Viterbi decoder, is connected to an overflow counter 42. An output of the overflow counter 42 is connected to an input of the property determining means 44. A first output of property determining means 44, carrying a signal INV, is connected to a first input of the demodulator 30. A second output of the property determining means 44, carrying a signal SH, is connected to a second input of the demodulator 30. A third output of the property determining means 44 are connected to a control input of a 2N–2/2N–1/2N frequency divider 40, an output of which is connected to a reset input of the depuncturing unit 32.

In the receiver 2 in FIG. 3, the received signal is demodulated by the demodulator 30. The demodulated signal is passed via the depuncturing unit 32 to the Viterbi decoder 34. Because the Viterbi decoder uses soft decoding information, the signal of the demodulator is not sliced, but it is represented with an accuracy of a few bits (3–4). The depuncturing unit 32 adds the symbols which are deleted by the puncturing unit in the convolutional encoder 24, in order to obtain again a code with a rate 1/2. Because the symbols to be inserted are unknown, the value of these symbols is set on a level between the level corresponding to a logical "0" and the level corresponding to a logical "1". This results in that the Viterbi decoder 34 regards these symbols as unreliable. At the first output of the Viterbi decoder 34 the decoded symbols are available. This decoded symbols are de-interleaved by the de-interleaver 36. The de-interleaved symbols are decoded by the Reed-Solomon decoder 38 to obtain the output symbols of the receiver 6.

At a second output of the Viterbi decoder, a signal indicating an overflow of the register holding one of the state metrics in the Viterbi decoder 34. It does not matter which state metric is used, because all the state metric have a same order of magnitude. The counter 42 counts the number of overflows, and signals the property determining means if the number of overflows exceeds a predetermined value.

The property determining means generates a control signal for the 2N–2/2N–1/2N divider, in order to generate a reset pulse for the depuncturing unit 32. By choosing the dividing rate 2N–2, 2N–1 or 2N, it is possible to delay, maintain or advance the start position of the depuncturing operation. The control signal RATE applied to the depuncturing unit 32 is intended to specify the rate of the convolutional code to be decoded, and consequently said signal determines the operation of the puncturing unit 32. The control signals INV and SH applied to the demodulator, are intended for introducing a spectrum inversion and phase shift respectively. The spectrum inversion may be required, because it is possible that on the transmission path the frequency spectrum has been inverted due to mixing with a local oscillator signal having a frequency higher than the frequency of the signal to be converted. By again inverting the spectrum, a signal having the same spectrum as the transmitted signal is obtained. The phase shift is required to deal with ambiguities of the phase of a reference carrier derived by a carrier recovery circuit. This phaseshift can be introduced by mutually exchanging the quadrature components at the output of the demodulator, possibly in combination of a change of sign of one of the quadrature components.

In the property determining means 44 according to FIG. 3, a first input carrying the signal OVF is connected to a measuring unit 50. An output of the measuring unit 50 is connected to an input of a register 56 and to a first input of a calculator/comparator 54. An output of the register 56 is connected to a second input of the calculator/comparator 54.

An output of the calculator/comparator 54 is connected to a first input of a state machine 52. A first output of the state machine 52 carries a signal INV for causing a frequency inversion of the output signal of the demodulator. A second output of the state machine 52 carries a signal SH for causing a phase shift of the output signal of the demodulator. A third output of the state machine 52 carries a signal SKIP for causing a shift over one symbol period of the depuncturing map applied by the depuncturing unit 32. A fourth output of the state machine 52 carries a signal RATE for setting the rate of the convolutional code to be used. A fifth output of the state machine 52 is connected to the measuring unit 50, and a sixth output of the state machine 52 is connected to an input of the calculator/comparator 54.

The state machine 52 instructs by the signal NEXT the measuring unit 50 to measure the time the counter 42 needs to reach a predetermined count. This measured time is inversely proportional to the metric growth in the Viterbi decoder 34. Consequently this time can be regarded as reliability measure indicating the reliability of the decoded symbols. The time can easily be measured by counting the number of symbol periods. If the predetermined count is reached, the calculator/comparator calculates the relative difference value between the previously measured time (which was stored in the register 56) and the actually measured time. It is observed that the state machine changed at least one of the signal properties before the start of the measurement by the measuring unit 50. A suitable relative difference measure can be found according to:

$$\Delta_m = \frac{\text{ABS}(T_1 - T_2)}{\text{MIN}(T_1, T_2)} \quad (2)$$

In (2) $T_1$ is the time value stored in the register 56, and $T_2$ is the actually determined time. After the calculation of $\Delta_m$ the value of $\Delta_m$ is compared to a threshold value. The result of said comparison is passed to the state machine 52 in response to a control signal issued by said state machine. In response to the result of the comparison, the state machines takes appropriate actions as will be explained below.

Figure 5:
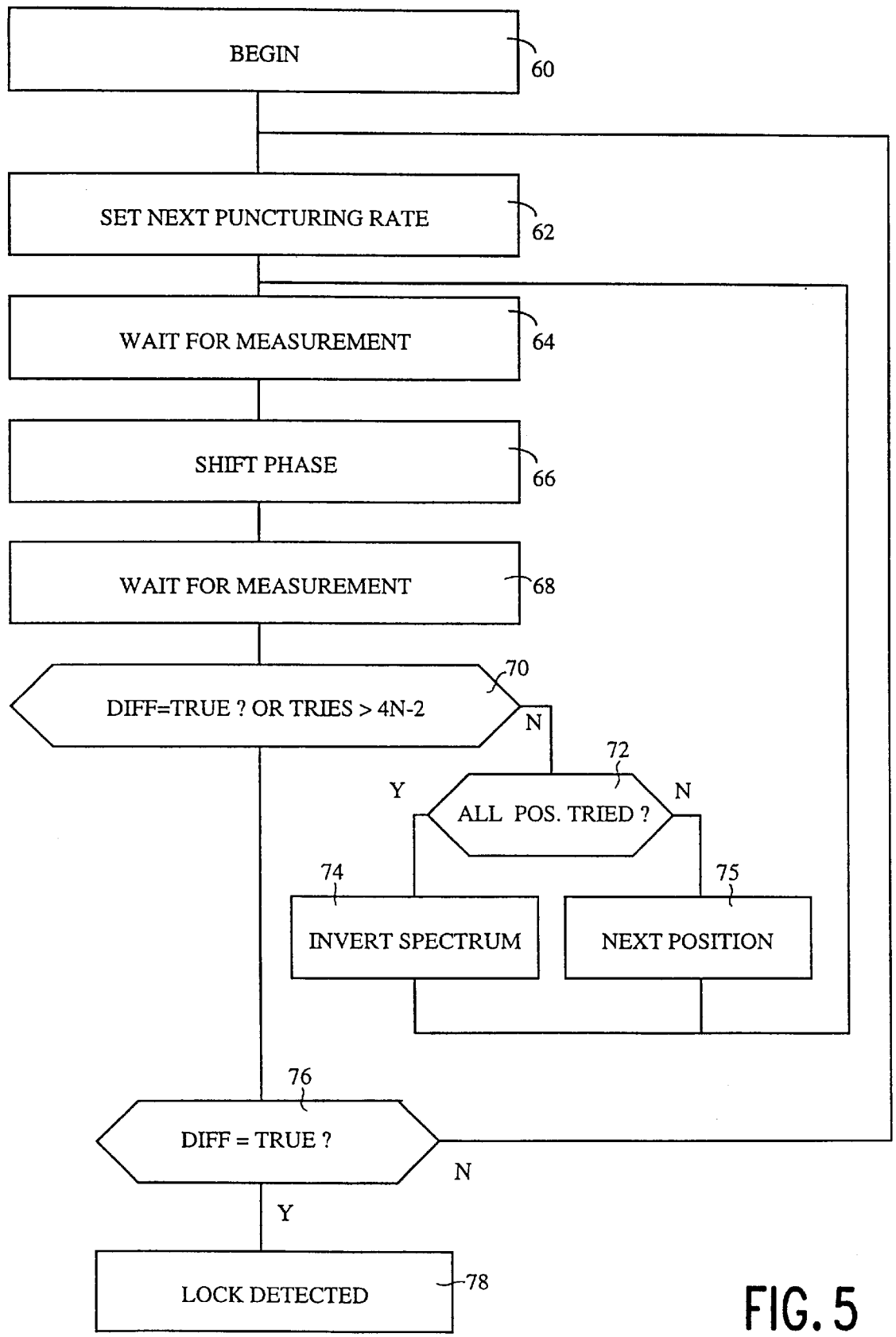
FIG. 5 is a flow diagram explaining the operation of a state machine 52 in FIG. 4.

In the flowgraph according to FIG. 5 the numbered instructions have the meaning according to the following table:

| No. | Inscript | Meaning |
| --- | --- | --- |
| 60 | BEGIN | All variables are initialised, and the program is started. |
| 62 | SET NEXT PUNCTURING RATE | The depuncturing unit 32 is informed about the next rate of the code to be used. |
| 64 | WAIT FOR MEASUREMENT | The measuring unit 50 is instructed to measure the time needed for P overflows of the state metric in the Viterbi detector 34. |
| 66 | SHIFT PHASE | The phase of the demodulated signal is shifted by 90°. |
| 68 | WAIT FOR MEASUREMENT | The measuring unit 50 is instructed to measure the time needed for N overflows of the state metric in the Viterbi detector 34. |
| 70 | DIFF=TRUE? OR TRIES >2N-1 | It is checked whether the difference value exceeds the threshold value or whether the number of tries exceeds 4N-2. |
| 72 | ALL POS TRIED? | It is checked whether all starting positions of the puncturing map have been tried. |
| 74 | INVERT SPECTRUM | The spectrum of the demodulated signal is inverted. |
| 75 | NEXT POSITION | The next possible start position of the puncturing map is tried. |
| 76 | DIFF=TRUE? | It is checked whether the difference value exceeds the threshold value. |
| 78 | LOCK DETECTED | The detection of an in lock situation is signalled |

Figure 4:
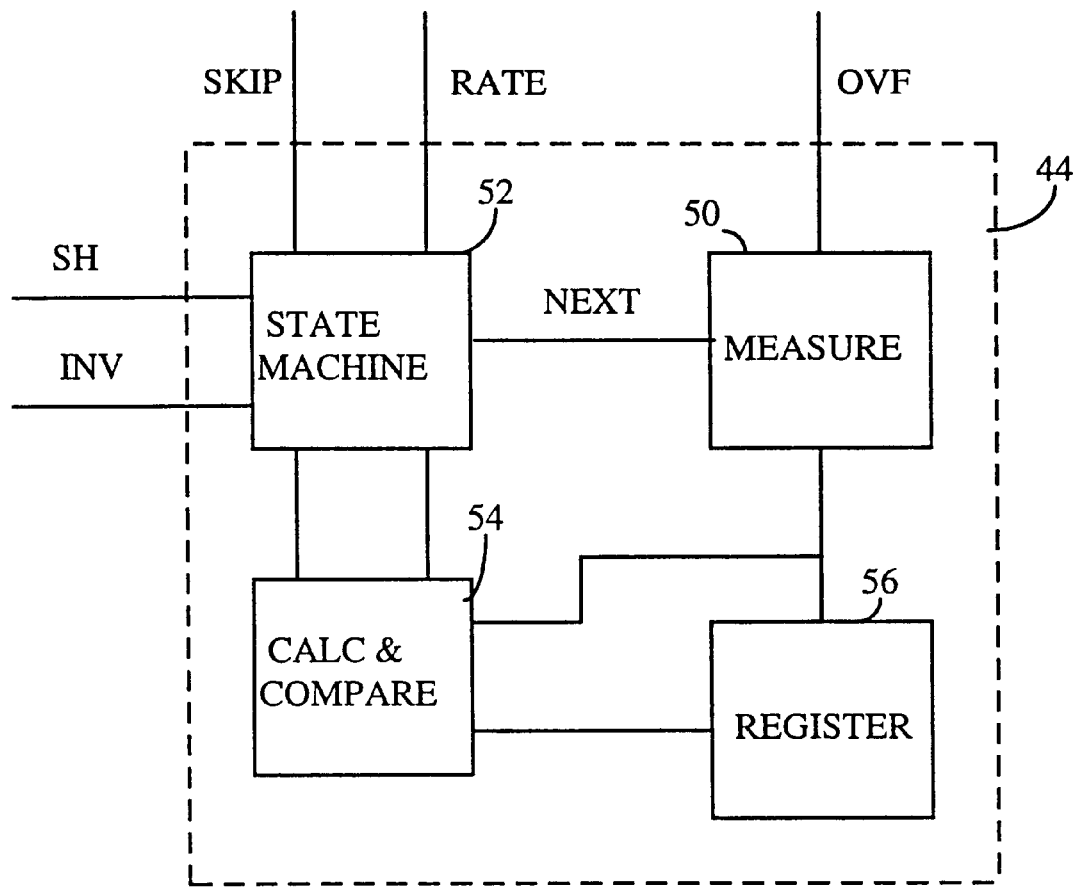
FIG. 4 shows an embodiment of the property determining means to be used in the receiver system according to FIG. 3.

In instruction 60 of the flow graph according to FIG. 4, all variables are set to their initial value and the program is started. In instruction 62 the puncturing rate of the code to be decoded is set to the next (or initial value). This is done by transmitting the signal RATE to the depuncturing unit 32. In instruction 64 the measuring of the reliability measure is started. After the reliability measure has been determined and is stored in the register 56, in instruction 66 the phase of the demodulated signal is shifted by 90° by issuing the signal SH. In instruction 68 the reliability measure for the newly selected phase is determined. It is observed that it is possible to restrict the phases to be tried to 0° and 90°. If the actual phase is 180° or 270°, the symbol stream would be inverted. Such an inverted bit stream can perfectly be decoded by a Viterbi decoder. The Reed-Solomon decoder can also recognize an inverted bitstream. The only measure to be taken, is to invert the bitstream at the output of the Reed-Solomon decoder if an inverted bitstream is detected.

In instruction 70 a signal representing the result of the comparison done by the calculator/comparator is read. If this result indicates that the difference measure exceeds the threshold value the program is continued with instruction 76. If 4N-2 tries have been made with the same puncturing rate (2N-1 for a non inverted spectrum of the demodulated signal, and 2N-1 for an inverted spectrum of the demodulated signal) the program is also continued with instruction 76. In instruction 76 is decided whether the search has to be terminated in instruction 78 or has to be continued with a new puncturing rate in instruction 62.

If none of the conditions in instruction 70 is met, in instruction 72 it is checked whether all starting positions (2N-1) for the present puncturing rate have been tried. If this is not the case, the next start position is chosen, and the program is continued with instruction 64. The signal SKIP is issued in order to shift the beginning of the puncturing map by one symbol. If the result of the comparison in instruction 72 indicates that all positions have been tried, the spectrum of the demodulated signal is inverted by issuing the signal INV in instruction 74. After the execution of instruction 74, the program continues with instruction 64.

It is observed that is is conceivable that there are situations in which a spectrum inversion cannot occur. Obviously, a spectrum inversion has not to be tried. In such a case, the instructions 72, 74 and 75 can be dispensed with, and the value 4N-2 in instruction 70 has to be replaced by 2N-1.

What is claimed is:

1. Transmission system comprising
   a transmitter for transmitting digital symbols via a transmission medium to a receiver,
   said receiver being provided with a decoder for deriving decoded symbols from an input signal of the receiver having a predetermined signal property out of a plurality of possible signal properties,
   said receiver comprising property determining means for determining said predetermined signal property from the received signal by determining the reliability of the decoded symbols,
   the property determining means further being arranged for deriving at least
   a first sequence of decoded digital symbols assuming a first signal property and
   a second sequence of decoded digital symbols assuming a second signal property,
   characterized in that the property determining means are arranged for indicating the signal property corresponding to the sequence of decoded symbols having the highest reliability as the correct signal property if a normalized difference measure of the reliability measures of the first and second sequence of decoded symbols exceeds a predetermined value.

2. Transmission system according to claim 1, characterized in that the reliability measure is proportional to the time required to obtain a predetermined increase of a path metric associated with the corresponding sequence of digital symbols.

3. Transmission system comprising a transmitter for transmitting digital symbols via a transmission medium to a receiver, said receiver being provided with a decoder for deriving decoded symbols from an input signal of the receiver having a predetermined signal property out of a plurality of possible signal properties, said receiver comprising property determining means for determining said predetermined signal property from the received signal by determining the reliability of the decoded symbols, the property determining means further being arranged for deriving at least a first sequence of decoded digital symbols assuming a first signal property and a second sequence of decoded digital symbols assuming a second signal property, characterized in that:

the property determining means are arranged for indicating the signal property corresponding to the sequence of decoded symbols having the highest reliability as the correct signal property if a relative difference measure of the reliability measures of the first and second sequence of decoded symbols exceeds a predetermined value, the transmitter comprises an encoder for encoding digital symbols according to one out of a plurality of codes, the signal property comprises at least the code used by the encoder and a further property, and the property determining means are arranged for deriving the at least first and second sequence of symbols by assuming the use of the same code but differing in at least the further property.

4. Transmission system according to claim 3, characterized in that the at least further property comprises the position of predetermined symbols in the sequence of coded symbols.

5. Transmission system according to claim 3, characterized in that the at least further property comprises a reference phase of a received signal modulated at least in phase.

6. Transmission system according to claim 3, characterized in that the at least further property comprises an indication whether or not the spectrum of the received signal is inverted.

7. Transmission system according to claim 3, characterized in that the reliability measure is proportional to the time required to obtain a predetermined increase of a path metric associated with the corresponding sequence of digital symbols.

8. Receiver comprising a decoder for deriving decoded symbols from an input signal of the receiver having a predetermined signal property out of a plurality of possible signal properties, said receiver comprising property determining means for determining said predetermined signal property from the received signal by determining the reliability of the decoded symbols, the property determining means further being arranged for deriving at least a first sequence of decoded digital symbols assuming a first signal property and a second sequence of decoded digital symbols assuming a second signal property, characterized in that the property determining means are arranged for indicating the signal property corresponding to the sequence of decoded symbols having the highest reliability as the correct signal property if a normalized difference measure of the reliability measures of the first and second sequence of decoded symbols exceeds a predetermined value.

9. Receiver comprising a decoder for deriving decoded symbols from an input signal of the receiver having a predetermined signal property out of a plurality of possible signal properties, said receiver comprising property determining means for determining said predetermined signal property from the received signal by determining the reliability of the decoded symbols, the property determining means further being arranged for deriving at least a first sequence of decoded digital symbols assuming a first signal property and a second sequence of decoded digital symbols assuming a second signal property, characterized in that:

the property determining means are arranged for indicating the signal property corresponding to the sequence of decoded symbols having the highest reliability as the correct signal property if a relative difference measure of the reliability measures of the first and second sequence of decoded symbols exceeds a predetermined value, the signal property comprises at least the code according to which the input signal is encoded and a further property, and the property determining means are arranged for deriving the at least first and second sequence of symbols by assuming the use of the same code but differing in at least the further property.

10. Receiver according to claim 9 characterized in that the property determining means are arranged for determining a normalised difference between reliability measures corresponding to decoded symbols differing in the at least further property.

11. Transmission method comprising transmitting digital symbols via a transmission medium, receiving an input signal from said transmission medium, deriving decoded symbols from the input signal, said input signal having a predetermined signal property out of a plurality of possible signal properties, the method further determining said predetermined signal property from the received signal by determining the reliability of the decoded symbols, characterized in that the method further comprises:

deriving at least a first sequence of decoded digital symbols assuming a first signal property and a second sequence of decoded digital symbols assuming a second signal property, and indicating the signal property corresponding to the sequence of decoded symbols having the highest reliability as the correct signal if a normalized difference measure of the reliability measures of the first and second sequence of decoded symbols exceeds a predetermined value.

* * * * *